(12) United States Patent
Montgomery et al.

(10) Patent No.: US 11,316,135 B2
(45) Date of Patent: *Apr. 26, 2022

(54) HIGH-EFFICIENCY QLED STRUCTURES

(71) Applicant: Sharp Kabushiki Kaisha, Osaka (JP)

(72) Inventors: David James Montgomery, Oxford (GB); Edward Andrew Boardman, Oxford (GB); Tim Michael Smeeton, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 35 days.

This patent is subject to a terminal disclaimer.

(21) Appl. No.: 17/094,125

(22) Filed: Nov. 10, 2020

(65) Prior Publication Data

US 2021/0057676 A1     Feb. 25, 2021

Related U.S. Application Data

(63) Continuation-in-part of application No. 16/517,971, filed on Jul. 22, 2019, now Pat. No. 10,930,888.

(51) Int. Cl.
*H01L 51/52* (2006.01)
*H01L 51/50* (2006.01)
*H01L 27/32* (2006.01)

(52) U.S. Cl.
CPC ........ *H01L 51/5265* (2013.01); *H01L 51/502* (2013.01); *H01L 51/504* (2013.01);
(Continued)

(58) Field of Classification Search
CPC . H01L 51/502; H01L 51/504; H01L 51/5206; H01L 51/5221; H01L 51/5234;
(Continued)

(56) References Cited

U.S. PATENT DOCUMENTS 7,245,065 B2   7/2007 Ghosh et al.
7,324,574 B2   1/2008 Kim
(Continued)

FOREIGN PATENT DOCUMENTS

WO   WO 2016144062   9/2016
WO   WO 2017205174   11/2017

*Primary Examiner* — Mohsen Ahmadi
(74) *Attorney, Agent, or Firm* — Renner, Otto, Boisselle & Sklar, LLP

(57) ABSTRACT

A light-emitting layer structure that maximizes constructive interference for light emission by varying a phase shift introduced by reflective electrodes. The light-emitting layer structure includes a first and second optical cavity including a first and second reflective electrode; a first and second partially transparent electrode; and a first and second emissive layer (EML) disposed between the first and second reflective electrodes and the first and second partially transparent electrodes, wherein the first EML emits light having a first wavelength; wherein the first reflective electrode introduces a first phase shift, depending on the first wavelength, on reflection of light emitted by the first EML; and wherein the second EML emits light having a second wavelength and the second reflective electrode introduces a second phase shift, depending on the second wavelength, on reflection of light emitted by the second EML, and the first phase shift is different from the second phase shift.

10 Claims, 11 Drawing Sheets

(52) U.S. Cl.
CPC ...... *H01L 51/5206* (2013.01); *H01L 51/5221* (2013.01); *H01L 51/5234* (2013.01); *H01L 51/5271* (2013.01); *H01L 2251/558* (2013.01)

(58) Field of Classification Search
CPC ............. H01L 51/5265; H01L 51/5271; H01L 51/558; H01L 2251/558
See application file for complete search history.

(56) References Cited

U.S. PATENT DOCUMENTS

| | | | |
|---|---|---|---|
| 7,728,512 | B2 | 6/2010 | D'andrade |
| 7,898,164 | B2 | 3/2011 | Lee et al. |
| 7,973,470 | B2 | 7/2011 | Cok |
| 8,378,570 | B2 | 2/2013 | Yamazaki et al. |
| 8,471,268 | B2 | 6/2013 | Moon et al. |
| 8,894,243 | B2 | 11/2014 | Cho et al. |
| 9,219,250 | B2 | 12/2015 | Jeong et al. |
| 9,362,530 | B2 | 6/2016 | Visser et al. |
| 9,583,727 | B2 | 2/2017 | Cho et al. |
| 9,722,200 | B2 | 8/2017 | Ma et al. |
| 10,522,787 | B1* | 12/2019 | Montgomery ...... H01L 27/3206 |
| 10,826,010 | B1* | 11/2020 | Montgomery ...... H01L 51/5271 |
| 2006/0158098 | A1 | 7/2006 | Raychaudhuri et al. |
| 2010/0327263 | A1 | 12/2010 | Lin et al. |
| 2011/0140075 | A1 | 6/2011 | Zhou et al. |
| 2013/0009925 | A1 | 1/2013 | Ueda et al. |
| 2013/0040516 | A1 | 2/2013 | Pruneri et al. |
| 2013/0099258 | A1 | 4/2013 | Lim et al. |
| 2014/0034927 | A1* | 2/2014 | Seo ..................... H01L 51/0072 257/40 |
| 2014/0131669 | A1 | 5/2014 | Park |
| 2014/0151651 | A1 | 6/2014 | Jin et al. |
| 2015/0060812 | A1 | 3/2015 | Kim et al. |
| 2015/0115236 | A1 | 4/2015 | Chung et al. |
| 2015/0340410 | A1 | 11/2015 | Hack et al. |
| 2015/0372258 | A1 | 12/2015 | Mizuno |
| 2016/0240820 | A1 | 8/2016 | He et al. |
| 2016/0315290 | A1 | 10/2016 | Zhang et al. |
| 2019/0165294 | A1* | 5/2019 | Forrest ............... H01L 51/5044 |
| 2019/0252644 | A1 | 8/2019 | Kajimoto |

\* cited by examiner

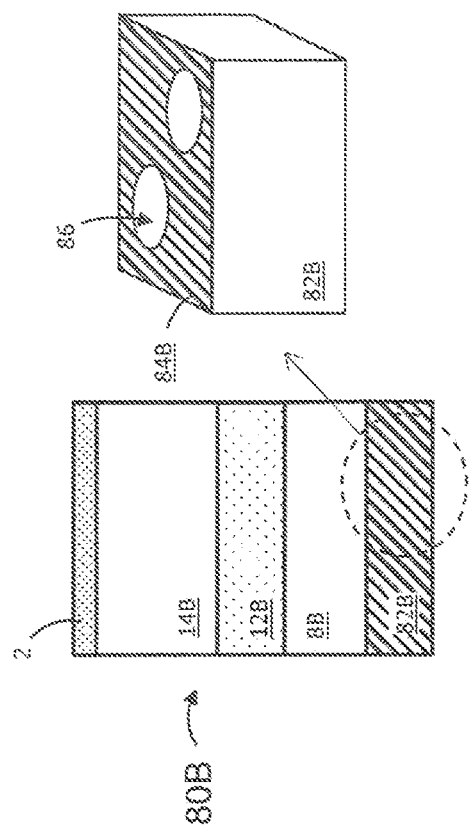
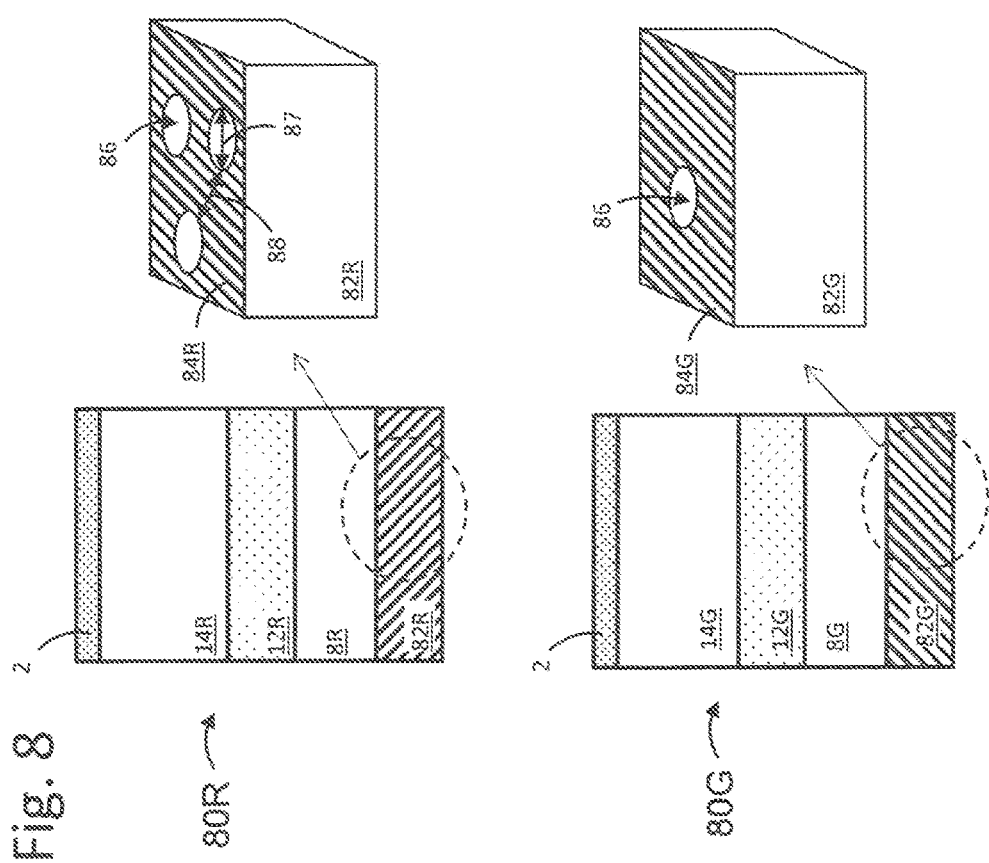
Fig. 8

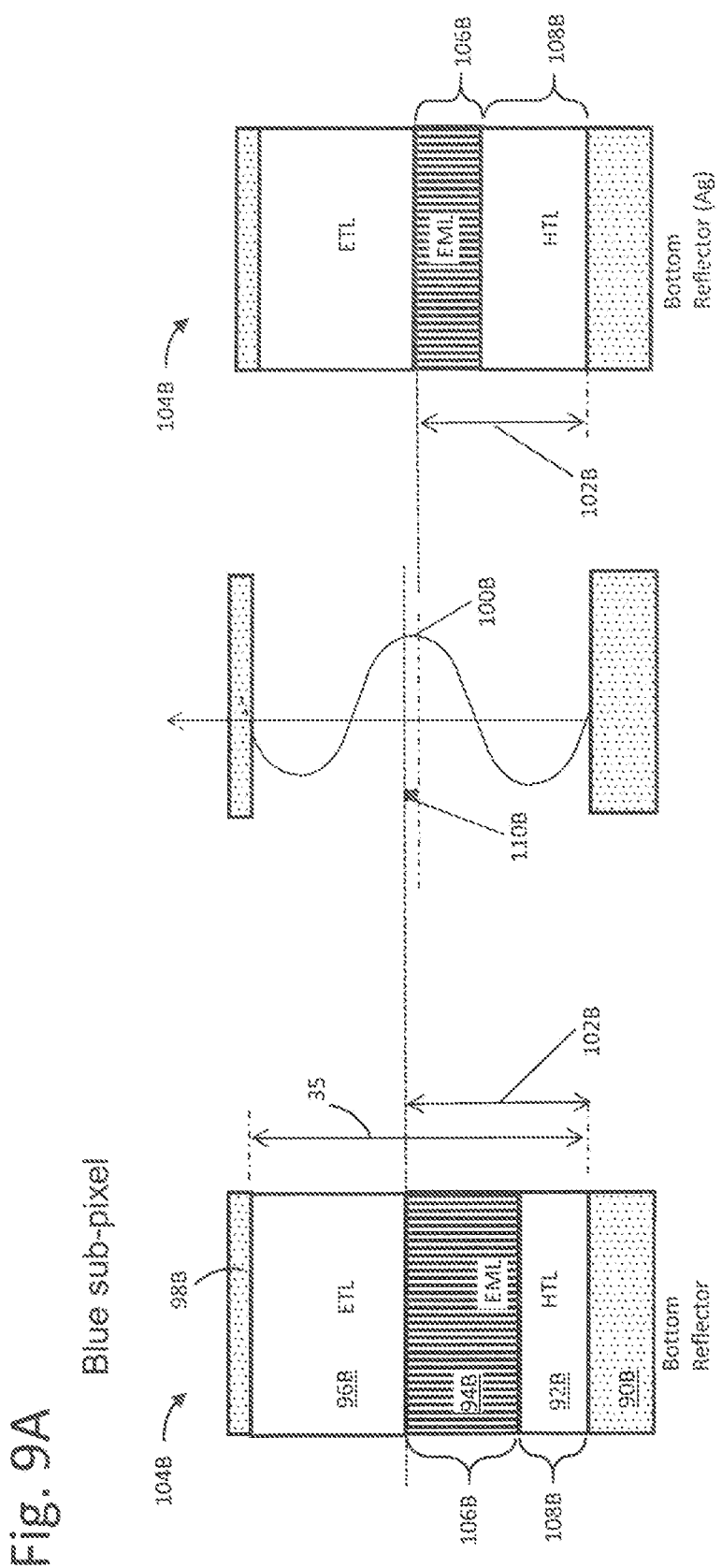
Fig. 9A Blue sub-pixel

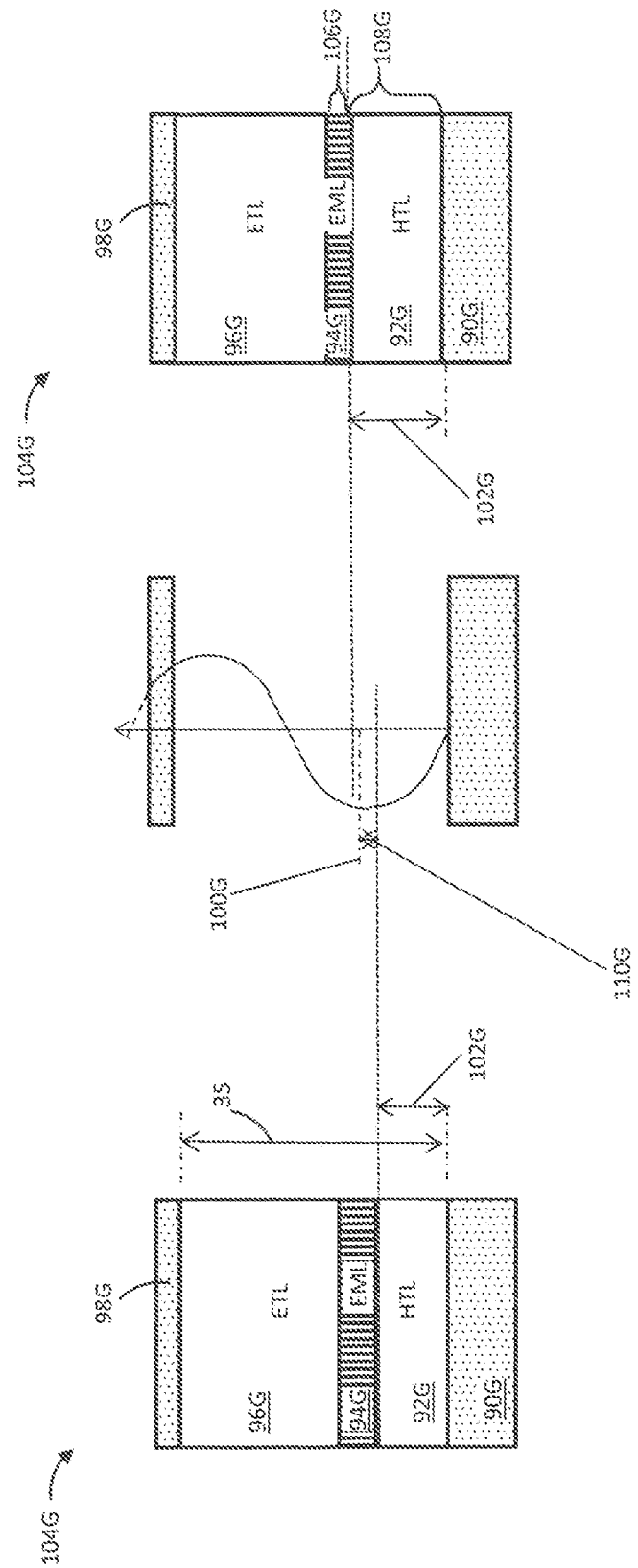

HIGH-EFFICIENCY QLED STRUCTURES

RELATED APPLICATIONS

This application is a continuation-in-part of U.S. application Ser. No. 16/517,971, filed on Jul. 22, 2019.

TECHNICAL FIELD

The present invention relates to a layer structure used in emissive devices, and, particularly, quantum dot (QD) light emitting diodes (QLEDs). QLEDs incorporating the present invention are used in displays to reduce complexity in the fabrication of the device while minimizing off-axis color shift and maximizing device efficiency.

BACKGROUND ART

Optical cavities are well known in semiconductor laser fabrication as described in U.S. Pat. No. 7,324,574 (Kim, issued Jan. 29, 2008). The use of cavities with organic LEDs (OLEDs) and QLEDs is also known as shown in US 2006/0158098 (Raychaudhuri et al., published Jul. 20, 2006), U.S. Pat. No. 9,583,727 (Cho et al., issued Feb. 28, 2017), and U.S. Pat. No. 8,471,268 (Moon et al., issued Jun. 25, 2013). Raychaudhuri et al. describe a top emitting OLED structure, and Cho et al. and Moon et al. describe QLED structures with light emitting regions between reflective areas, one of which is partially transmitting.

Typically, QLED pixels include a red sub-pixel, a green sub-pixel, and a blue sub-pixel. Due to the differing wavelengths of emission of the three sub-pixels, the cavities must, in general, be different in size and shape for the angular emission to be similar enough to minimize off-axis color shift. Having different sub-pixel structures increases device complexity and leads to significant costs for fabrication, and often compromises are made in efficiency to achieve acceptable costs. Methods for reducing the complexity of fabricating sub-pixels of different sizes include US 2015/0340410 (Hack et al., published Mar. 26, 2019), which describes cavities with different optical path lengths within multiple sub-pixels.

Other modifications described in the art that improve performance result in adding complexity to the fabrication of a cavity structure in an LED by adding additional processing steps such as roughening or patterning. For example, US 2014/0151651 (Jin et al., published Jun. 5, 2014) describes roughening of the top electrode to enhance extraction, and U.S. Pat. No. 8,894,243 (Cho et al., issued Nov. 25, 2014) describes patterning of the base reflecting material. Further modifications described in the art add complexity by adding additional layers to the device. For example, U.S. Pat. No. 9,219,250 (Jeong et al., issued Dec. 22, 2015) describes a film with a striped layer with alternate high and low reflective index, and US 2013/0009925 (Ueda et al., published Jan. 10, 2013) describes tilted emissive layers with prism layers outside the cavity. The conventional structures described above are complex additions to the fundamental cavity structure of the LED.

To address design and manufacturing complexity, hybrid and composite electrode solutions have been proposed. For example, U.S. Pat. No. 8,378,570 (Yamazaki, issued Feb. 19, 2013) uses dual layers on its conductor layers with differing metallic concentrations. The first layer comprises a metal and the second layer is generally the same metal with differing concentrations of non-metallic materials such as carbon and oxygen. The dual layer conductors are provided to improve charge transport and to reduce the voltages required to operate a device. US 2013/0040516 (Pruneri et al., published Feb. 14, 2013) describes a three-layer top electrode for an OLED device that is designed to reduce reflectivity of the top electrode. The center layer is a silver layer and the top and bottom layers are non-metallic layers designed to create an interference structure that minimizes reflection from the top electrode.

SUMMARY OF INVENTION

There is a need in the art, therefore, for increased efficiency and improved brightness for light emitting structures while reducing device and manufacturing complexity. Embodiments of the present application provide an enhanced arrangement for an emissive display pixel using a reflective electrode that causes a specific phase shift with a quantum dot (QD) or organic electroluminescent material in an LED arrangement. This arrangement typically includes multiple sub-pixels, each of which emits light of a different color or wavelength, and each includes a layer of emissive material disposed between an electron transport layer (ETL) and a hole transport layer (HTL). This sub-pixel stack is then disposed between two conducting electrode layers, one side of which is disposed on a substrate and a second conductive layer disposed on the opposite side of the sub-pixel stack to form an optical cavity. At least one of the conducting layers reflect light emitted by the emissive material in the optical cavity. A conducting layer is configured to introduce a phase shift on reflection that depends on the color, i.e., wavelength, of the associated sub-pixel. Embodiments of the present application may be implemented in "top-emitting" (TE) structures in which the emission is from a side of a device opposite from the substrate. Embodiments of the present application also are applicable to "inverted" structures for which the layer sequence is substrate/cathode/ETL/QD emissive layer/HTL/anode.

Generally, a different structure for an optical cavity is required for different colors of light emission. To maximize constructive interference, the round-trip path for light reflected in the optical cavity should correspond to a phase shift of $2n\pi$, where n is an integer. The round-trip path for light in the optical cavity is from a top reflector, i.e., a first conducting electrode layer of the two conducting electrode layers, to the bottom reflector, i.e., a second conducting electrode layer of the two conducting electrode layers, and back to the top reflector.

To form an LED that maximizes constructive interference, embodiments of the present application use a layer structure in which the layer thicknesses of the charge transport layers, the emissive layers, and the reflective electrode layers may be the same for two or more sub-pixels. To emit light that generates the maximum constructive interference in the cavity, the embodiments of the present application vary the configuration of the conducting reflective layer to introduce a phase shift depending on the color of light, i.e., wavelength, of an associated sub-pixel. For example, a sub-pixel configured to emit a longer wavelength, e.g., red light, may have a reflective electrode with one or more features to introduce a phase shift. The one or more features include forming a sub-pixel with a different metal from other sub-pixels, forming a sub-pixel with a different multilayer structure from other sub-pixels, and forming a sub-pixel with different patterned layers from other sub-pixels. The multilayer structure may include non-metallic layers configured to introduce a specific phase shift. The one or more patterned layers may include a single metal material for different sub-pixels with one or more thin metal layers formed on top of a first metal layer. The pattern of the one or more patterned layers may correspond to a wavelength associated with a specific sub-pixel.

An aspect of the invention is a light-emitting layer structure using a reflective electrode that causes a specific phase shift for optimized light extraction efficiency depending on a wavelength of emitted light. In exemplary embodiments, the light-emitting structure includes a first optical cavity having a first reflective electrode; a first partially transparent electrode; and a first emissive layer (EML) disposed between the first reflective electrode and the first partially transparent electrode that is configured to emit light having a first wavelength. The first reflective electrode is configured to introduce a first phase shift, depending on the first wavelength, on reflection of light emitted by the first EML. The light-emitting structure further includes a second optical cavity having a second reflective electrode; a second partially transparent electrode; and a second EML disposed between the second reflective electrode and the second partially transparent electrode that is configured to emit light having a second wavelength. The second reflective electrode is configured to introduce a second phase shift, depending on the second wavelength, on reflection of light emitted by the second EML, and the first phase shift is different from the second phase shift.

In exemplary embodiments, each of the first reflecting electrode and the second reflecting electrode includes a base layer and at least one emitting side layer located on an emitting side of the base layer, wherein the at least one emitting side layer has a thickness less than a thickness of the base layer, and preferably the at least one emitting side layer has a thickness from 0.5 nm to 12 nm. The at least one emitting side layer may have a real component of refractive index that is higher than a real component of refractive index of the base layer. In exemplary embodiments, the at least one emitting side layer includes a first emitting side layer and a second emitting side layer located on an emitting side of the first emitting side layer, wherein a combined thickness of the first emitting side layer and the second emitting side layer is from 0.5 nm to 12 nm. The second emitting side layer may have a real component of refractive index that is higher than a real component of refractive index of the first emitting side layer, and the first emitting side layer may have a real component of refractive index that is higher than a real component of refractive index of the base layer.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

FIG. 8 is a drawing depicting three patterned reflective electrodes in accordance with embodiments of the present invention.

FIGS. 9A, 9B, and 9C are drawings depicting constructive interference in sub-pixels in accordance with embodiments of the present invention.

DESCRIPTION OF EMBODIMENTS

Figure 1:
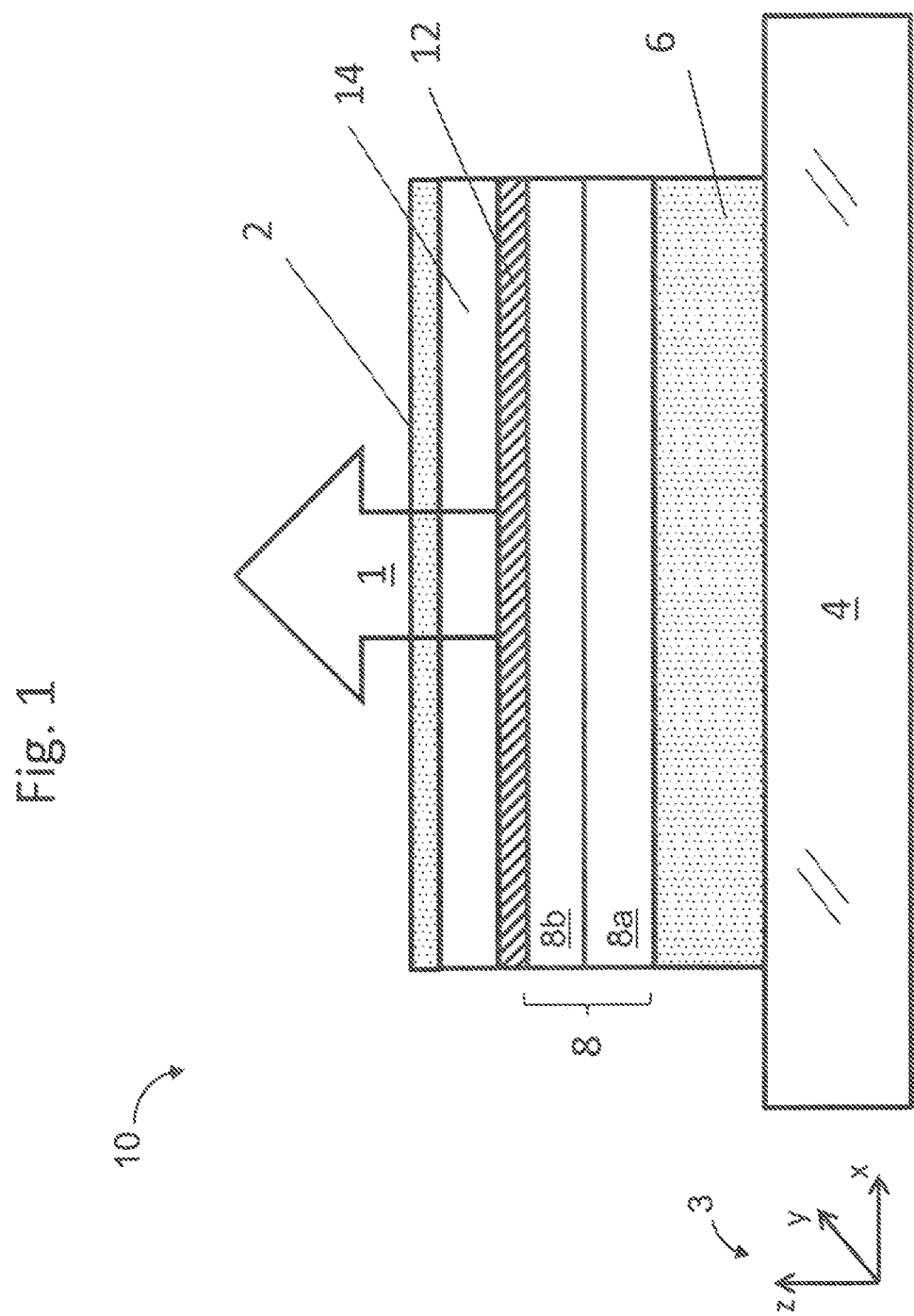
FIG. 1 is a drawing depicting an exemplary top emitting light-emitting device structure.

Embodiments of the present invention will now be described with reference to the drawings, wherein like reference numerals are used to refer to like elements throughout. It will be understood that the figures are not necessarily to scale.

FIG. 1 is a drawing depicting an exemplary top emitting (TE) light-emitting device structure 10. The TE structure 10 emits light 1 through a top conducting layer, a top electrode 2, that is a partial reflector formed opposite from a substrate 4. The substrate 4 may be a glass substrate on which a bottom conducting layer, a bottom electrode 6, is formed. The thickness of the bottom electrode 6 may be greater than 80 nm. The bottom electrode 6 may be a metallic material configured to reflect light to enhance emission through the top electrode 2. The bottom electrode 6 is typically aluminum, silver, Indium Tin Oxide (ITO), and the like or a combination thereof. The bottom electrode 6 may be connected to a voltage source for applying different voltages to the first electrode in different sub-pixels, for example a thin film transistor (TFT) backplane.

A hole transport layer (HTL) 8 may be formed on the bottom electrode 6. The HTL 8 may include two layers, a first HTL sub-layer 8a formed using a material such as PEDOT:PSS (poly(3,4-ethylenedioxythiophene) polystyrene sulfonate), and a second HTL sub-layer 8b formed using a material characterized by a high hole mobility such as TFB [poly(9,9'-dioctylfluorene-co-bis-N,N'-(4-butylphenyl)diphenylamine)]. An emissive layer (EML) 12 may be formed on the HTL 8. The EML 12 may include nanoparticles such as quantum dots, organic light emitting materials, and the like. An electron transport layer (ETL) 14 may be formed on the EML 12. The ETL 14 may be formed using a material characterized by high electron mobility such as nanoparticle Zinc Oxide.

The top electrode 2 is a thin metal layer such as silver, magnesium-silver alloy, and the like. The top electrode 2 may be thick enough to carry sufficient current but thin enough to be sufficiently transparent for adequate light emission. The top electrode 2 may be less than 30 nm thick, and may be approximately 10 nm to 15 nm thick. In a TE light-emitting structure 10, light emission is through the partially reflective top electrode 2. FIG. 1 also shows an xyz-coordinate system 3 that is applicable throughout the description in connection with subsequent figures.

The configuration of FIG. 1 may be referred to in the art as a "normal structure", with the bottom electrode 6 closest to the substrate constituting the anode, and the top electrode 2 farthest from the substrate constituting the cathode. An alternative configuration is referred to in the art as an "inverted structure", in which the bottom electrode 6 closest to substrate constitutes the cathode and the electrode layer 2 farthest from the substrate constitutes the anode. In an inverted structure, the charge transport layer 8 is the ETL and the charge transport layer 14 is HTL. Accordingly, the ETL and HTL may be referred to herein generally as charge transport layers (CTL) as appropriate.

Embodiments of the present application can be applied to both OLED (organic light emitting material) and QLED (light emitting quantum dots) for the EML 12. However, embodiments of the present application under certain circumstances may be better suited for QLED over OLED devices because of the inherent narrow line width of the emission and the resulting specific phase shift on the lower material.

Figure 2:
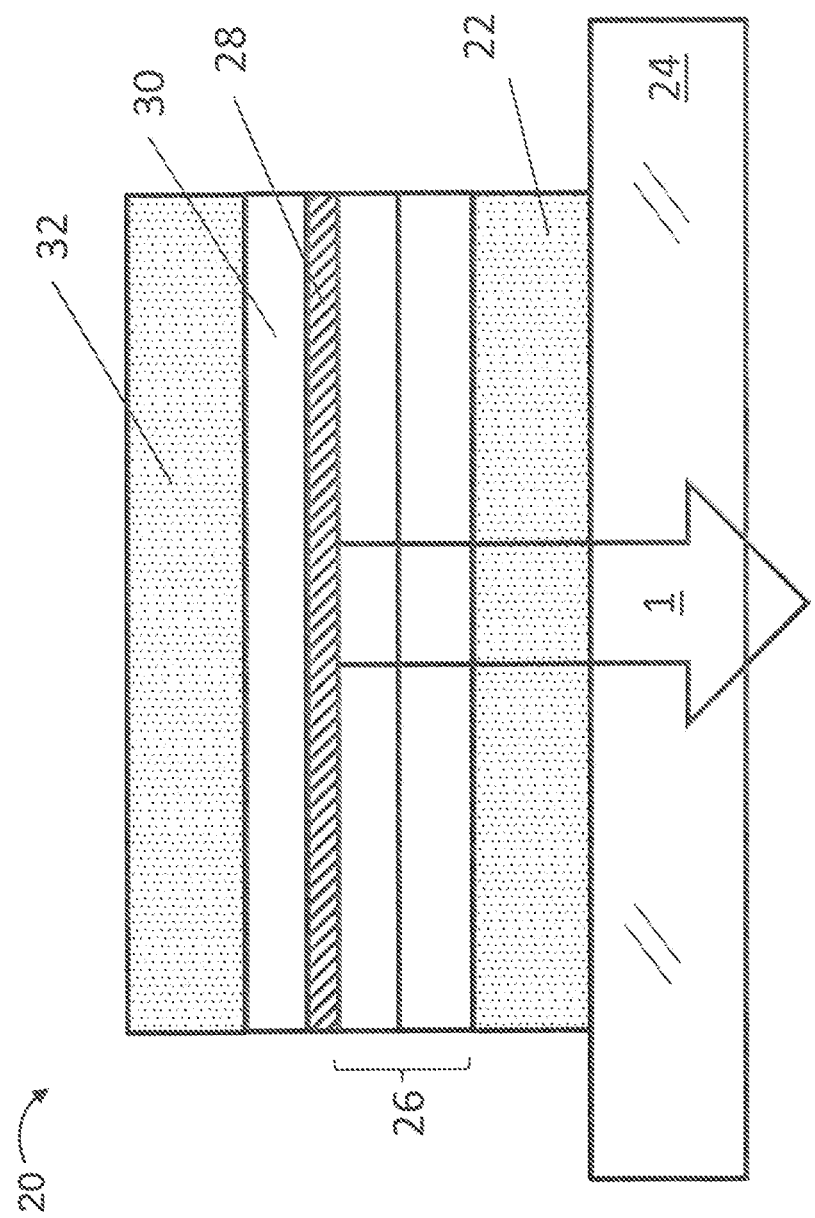
FIG. 2 is a drawing depicting an exemplary bottom emitting light-emitting device structure.

FIG. 2 is a drawing depicting an exemplary bottom emitting (BE) light-emitting device structure 20. The BE structure 20 emits light 1 through a bottom electrode 22 and a transparent substrate 24. The BE structure 20 includes an HTL 26, an emissive layer (EML) 28, and an ETL 30 that are similar to or composed comparably as the layers formed in the TE structure 10. The BE structure 20 includes a top electrode 32 that may be a thick opaque metal, such as silver or aluminum, configured to reflect light emitted from the emissive layer to enhance emission through the bottom electrode 22. The bottom electrode 22 may be a partial reflector such as Indium Tin Oxide (ITO), indium doped zinc oxide (IZO), fluorine doped tin oxide (FTO), or particles of silver (e.g. nanoparticles, nanowires). The use of a partial reflector such as ITO that is substantially more transmissive than thin metal layers facilitates the fabrication of thicker electrodes to serve as the bottom electrode 22. The example of FIG. 2 also is depicted as a normal structure, although a BE device also may be configured as an inverted structure as described above with respect to FIG. 1.

Embodiments of the present application can apply equally to top and bottom emitting structures that incorporate a reflective electrode that introduces a phase shift. The following description generally is in connection with top emitting structures, but embodiments of the present application described herein may also be used in bottom emitting structures.

Figure 3:
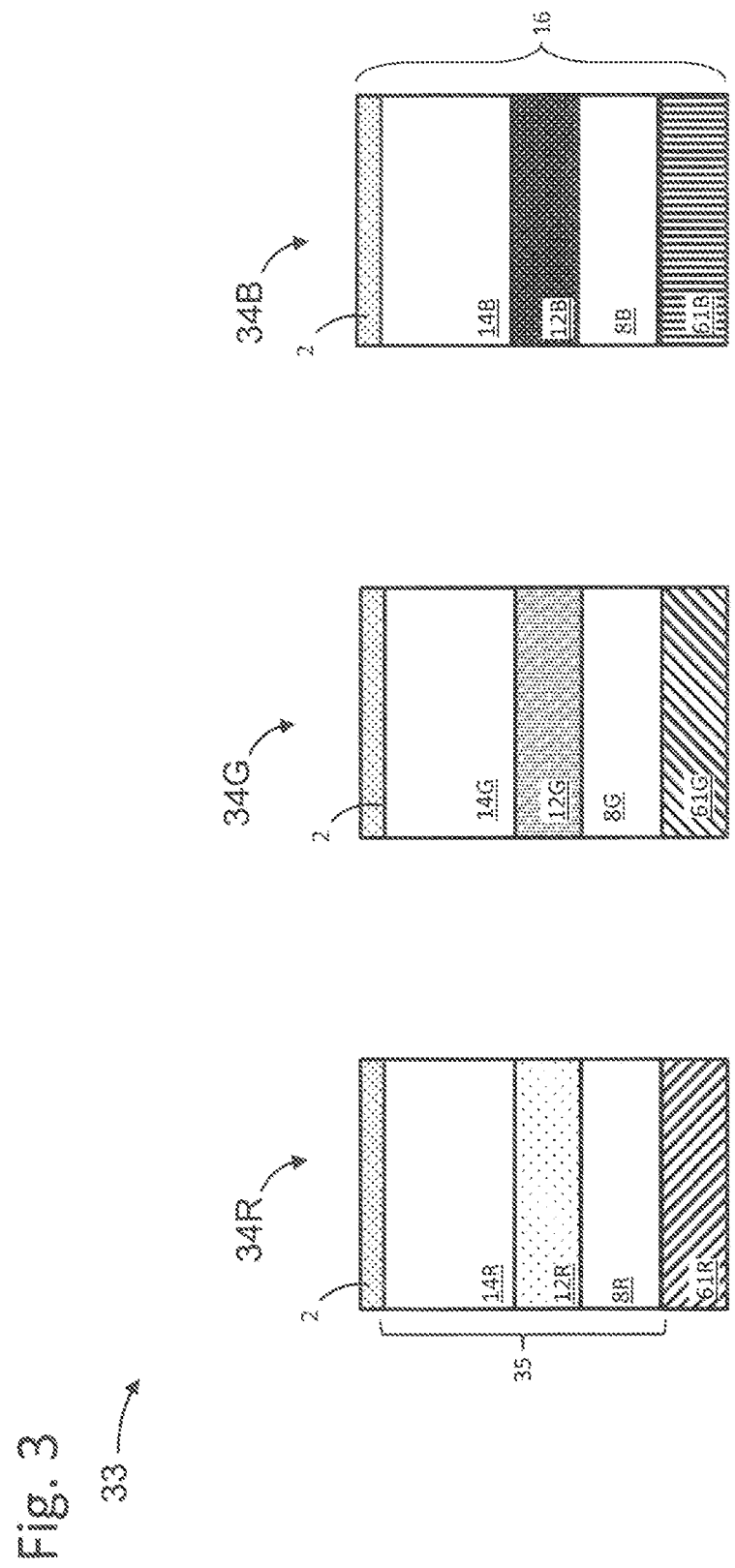
FIG. 3 is a drawing depicting a display pixel including three sub-pixels in accordance with embodiments of the present invention.

FIG. 3 is a drawing depicting a display pixel including three sub-pixels in accordance with embodiments of the present application. A display pixel may include two or more sub-pixels each of which emits light of a different color, i.e., wavelength. An exemplary top-emission display pixel 33 includes three sub-pixels including a red sub-pixel 34R, a green sub-pixel 34G, and a blue sub-pixel 34B. The display pixel 33 may emit white light when all three sub-pixels are emitting light. A thickness 16 of the sub-pixels is on the order of 100-200 nm. The display pixel 33 has layers that are comparable as in the conventional configurations of FIGS. 1 and 2, and thus like layers are identified with like reference numerals, and with designations "R", "G", and "B" corresponding respectively to the red, green, and blue sub-pixels.

An optical cavity 35 is formed by a first metallic reflector, i.e., the top electrode 2 and a second metallic reflector, i.e., the bottom electrode 61 in each sub-pixel. For a 'top-emitting' device, the primary light emission is through the top electrode 2 of the optical cavity 35, and the bottom electrode 61 is an optically reflective layer for light emitted by each sub-pixel. The bottom electrode 61 may be a metallic material such as one or more of silver, aluminum, titanium and the like. For a 'top-emitting' device, the top electrode 2 is configured to have a high optical transmission for light emitted by each sub-pixel. The top electrode 2 may be a conductive layer that is thick enough to have sufficiently low electrical resistance so that it can carry sufficient electrical current without a large voltage drop, but thin enough to be partially transparent to the light emitted by the device. In alternative embodiments, the top electrode 2 may include a conductive material with high optical transmissivity such as indium doped tin oxide (ITO), indium doped zinc oxide (IZO), fluorine doped tin oxide (FTO), particles of silver (e.g. nanoparticles, nanowires).

The optical cavity 35 provides an arrangement that reflects light emitted from the emissive layer 12 back and forth between the electrodes to cause interference with light in the optical cavity 35. At particular angles, the interference is constructive. When the interference is constructive, the round-trip top reflector to top reflector pathway that light travels is $2n\pi$, with n being an integer and is referred to as the "mode" of the cavity. Constructive interference, and therefore light emission, is strong in optical cavities formed to reflect light at $2n\pi$. Preferably, a proper cavity is designed so that this constructive condition is met with light approximately on axis, normal to the top electrode plane. In this case the display is brightest on axis and the efficiency is maximal. Several elements contribute to the phase shift in the optical cavity 35. The thicknesses and refractive indices of the layers between the top electrode 2 and the bottom electrode 61 control the phase shift of light in the optical cavity 35. Additionally, reflection at each of the top electrode 2 and the bottom electrode 61 can contribute a significant phase shift, especially for metallic electrodes. This phase shift is dependent on the electrode material and the material next to the electrode to which the light is incident. The top electrode 2 and/or the bottom electrode 61, along with the adjacent CTL, may be configured to control the phase shift on reflection such that one or more layers of the device can be the same for multiple sub pixels, and thus fabrication issues are mitigated and performance can be improved.

Conventional design processes add additional layers or alter the thickness of layers in the cavity so that the constructive interference happens for light propagating normal to the layers. As the interference is highly wavelength dependent, conventional approaches use a different structure for each sub-pixel of different color light emission to meet these criteria. Thus, different layer thicknesses conventionally are required for red, green and blue wavelengths, which may be difficult to individually fabricate, as fabrication requires a patterning technique with multiple stages. The present application describes structures and methods that facilitate QLED structures patterned with layers of equal or substantially similar thickness between sub-pixels, to reduce complexity and the number of stages as compared to conventional configurations.

In particular, embodiments of the present application provide a structure in which the thickness of the top electrode 2, the bottom electrode 61, the ETL 14, the EML 12, and the HTL 8 are substantially the same thickness in each sub-pixel of different wavelength emission. To form a sub-pixel with an optical cavity 35 that maximizes the emission of the respective wavelength, the top electrode 2, the bottom electrode 61, or a combination thereof are different for at least two of the sub-pixels. To optimize the path that the emitted light travels in the optical cavity 35, the bottom electrode 61 in each sub-pixel is made with a different metallic material. For example, the bottom electrode of the red sub-pixel 61R may comprise a first metal material, the bottom electrode of the green sub-pixel 61G may comprise a second metal material, and the bottom electrode of the blue sub-pixel 61B may comprise a third metal material. The bottom electrode 61 for each sub-pixel is configured to cause a sub-pixel specific phase shift. The phase shift is configured based on the color of emitted light associated with the sub-pixel. Each metallic layer has a different phase shift compared to the metallic layers in sub-pixels associated with a different wavelength. The metallic layers can be chosen so that the associated phase shift causes a total round-trip phase shift of $2n\pi$. The device layers (electrodes, EML, ETL, HTL) are substantially similar or the same thickness. The emissive layers may be a different material between the sub-pixels but have similar thicknesses.

For example, the red sub-pixel 34R has an EML 12R with a first emissive material, the green sub-pixel 34G has an EML 12G with a second emissive material, and the blue sub-pixel 34B has an EML 12B with a third emissive material. Each EML 12 is configured to emit light associated with a specific wavelength.

Figure 4:
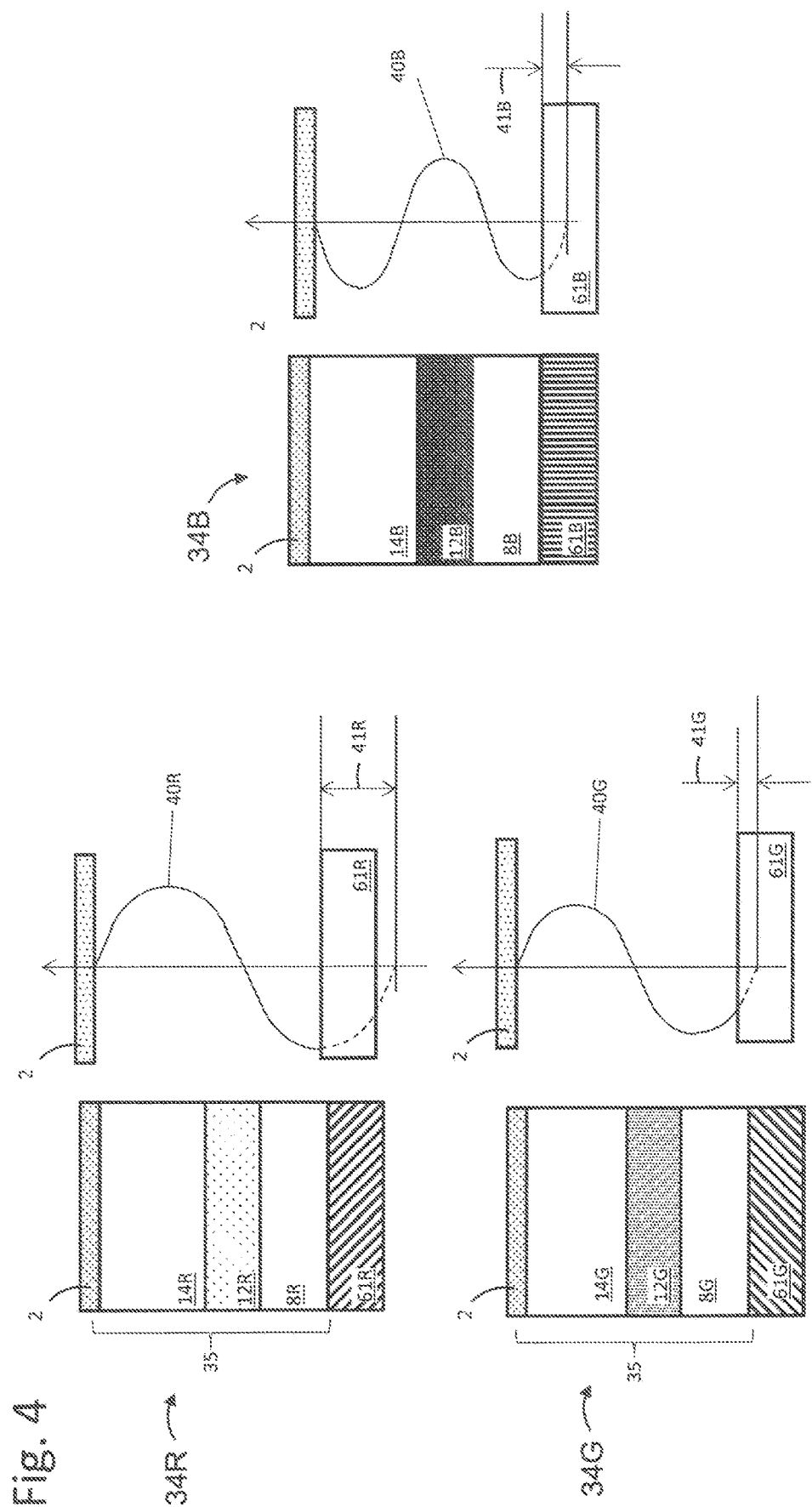
FIG. 4 is a drawing depicting phase shift of the electric field distribution in the optical cavity of three sub-pixels in accordance with embodiments of the present invention.

FIG. 4 is a drawing depicting phase shift of the electric field distribution in the optical cavity of three sub-pixels in accordance with embodiments of the present application. An electrical field distribution 40R associated with the red sub-pixel 34R is shown in FIG. 4. The bottom electrode 61R is configured to introduce an effective phase shift on reflection 41R. The optical cavity 35 thickness may not be precisely $n\lambda/2$ for red light, so a phase shift is applied to enhance the emission efficiency. The effective phase shift on reflection 41R is applied to the electrical field distribution 40R on reflection and a standing wave pattern of one wavelength for red light is excited for a second order mode, n=2.

An electrical field distribution 40G associated with the green sub-pixel 34G also is shown in FIG. 4. The bottom electrode 61G is formed using a different material from the bottom electrode 61R and is configured to introduce the effective phase shift on reflection 41G. The optical cavity 35 thickness may not be precisely $n\lambda/2$ for green light, so again a phase shift is applied to enhance the emission efficiency. The effective phase shift on reflection 41G is applied to the electrical field distribution 40G on reflection and a standing wave pattern of approximately one wavelength for green light is excited for a second order mode, n=2.

An electrical field distribution 40B associated with the blue sub-pixel 34G also is shown in FIG. 4. The bottom electrode 61B is formed using a different material than the bottom electrode 61R and is configured to introduce the effective phase shift on reflection 41B. The bottom electrode 61B may be the same material or a different material as the bottom electrode 61G. The optical cavity 35 thickness may not be precisely $n\lambda/2$ for blue light, so again a phase shift is applied to enhance the emission efficiency. The effective phase shift on reflection 41B is applied to the electrical field distribution 40B on reflection and a standing wave pattern of approximately $3\lambda/2$ wavelengths for blue light is excited for a third order mode, n=3.

The electrical field distribution 40R corresponds to red light and is associated with a longer wavelength than the electrical field distribution 40G corresponding to green light and the electrical field distribution 40B corresponding to blue light. Accordingly, to enable equal or substantially similar layer thicknesses for the individual layers, the bottom electrode 61R is configured for a greater phase shift on reflection 41R for the longer red wavelength as compared to the green and blue wavelengths 41G and 41B. The overall result of the respective phase shifting is to maximize output efficiency for each color, while permitting commonality of certain layer thicknesses, such as for example the CTLs, to reduce complexity of the combined pixel structure. In exemplary embodiments, certain layers, such as for example one or more of the CTLs and/or the other electrode (top electrode 2 in this example), may be shared among sub-pixels for an optimal reduction of complexity.

Suitable materials for the bottom electrode 61 to form a base reflector include silver, aluminum, chromium, tin, titanium, palladium, gallium, and the like.

These metals may be deposited by thermal evaporation. Higher melting-point metals, such as platinum, tungsten, tantalum, zirconium, and the like may also be used and may be deposited by electron-beam evaporation. The material for the bottom electrode may include non-metallic materials such as ITO. Such non-metallic materials are conducting and may be selected to introduce a different phase shift to reflection than metal materials. Alternative materials such as interference film layers may also be integrated to provide a different phase shift between two sub-pixels. In alternative embodiments, gold and copper may be used and have different responses depending on the wavelength. For example, for blue wavelengths, gold as a different response than red and green wavelengths. For red wavelengths, copper has a different response than green and blue wavelengths. These characteristics may be beneficial depending on the specific application. One of ordinary skill in the art would recognize many variations, modifications, and alternatives.

Embodiments of the present application can also be used for a bottom emitting structure where all the features described can be applied to the underside of the top electrode 2 in a bottom emitter.

The embodiments here can also be applied to the case when the top electrode 2 in a top emitting structure 10 is relatively transparent, for example in the case of ITO where the reflectivity is <5-10%. In this case the distance between the source and the base reflector 6 is still important, as the reflection can interfere with the upward emitted light. The choice of material (and layers) between the reflector and source (layer 8) still need to be correctly chosen and the application of extra metal layer to shift phase can be applied in this case as well.

Figure 5:
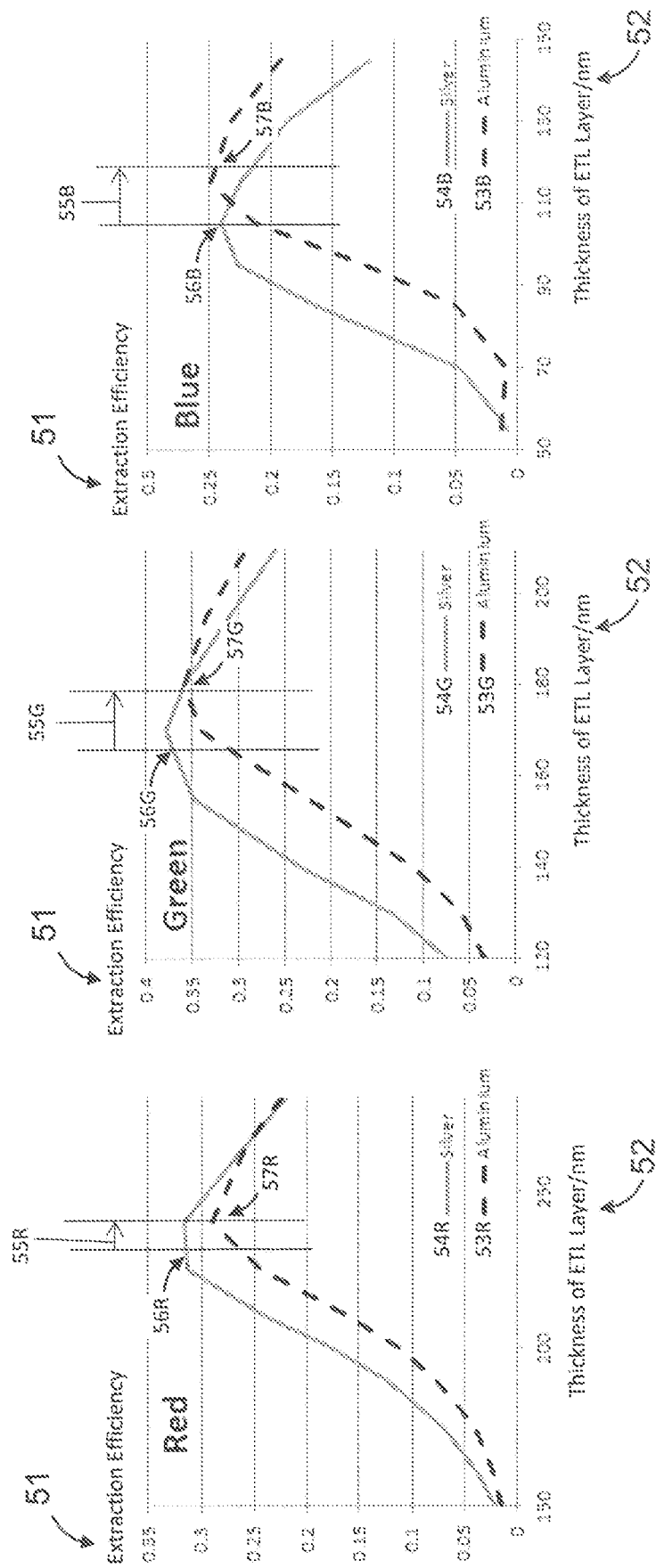
FIGS. 5A, 5B, and 5C are drawings depicting the effect of different electrode materials on the phase shift in a sub-pixel in accordance with embodiments of the present invention.

FIGS. 5A, 5B, and 5C are drawings depicting the effect of different electrode materials on the phase shift in a sub-pixel in accordance with embodiments of the present application. FIG. 5A illustrates a plot of extraction efficiency versus ETL thickness for a red sub-pixel with different electrode materials. A first trace 53R shows the extraction efficiency of an aluminum electrode versus the thickness of the ETL layer. A second trace 54R shows the extraction efficiency of a silver electrode versus the thickness of the ETL layer. A peak shift 55R is defined by the change in thickness between a first peak extraction efficiency 56R associated with the first trace 53R and a second peak extraction efficiency 57R associated with the second trace 54R. The peak shift is due to the different material for the reflector causing a different phase shift on reflection of light incident on the corresponding electrode.

FIG. 5B illustrates a plot of extraction efficiency versus ETL thickness for a green sub-pixel with different electrode materials. A first trace 53G shows the extraction efficiency of an aluminum electrode versus the thickness of the ETL layer. A second trace 54G shows the extraction efficiency of a silver electrode versus the thickness of the ETL layer. A peak shift 55G is defined by the change in thickness between a first peak extraction efficiency 56G associated with the first trace 53G and a second peak extraction efficiency 57G associated with the second trace 54G. The peak shift is due to the different material for the reflector causing a different phase shift on reflection of light incident on the corresponding electrode.

FIG. 5C illustrates a plot of extraction efficiency versus ETL thickness for a blue sub-pixel with different electrode materials. A first trace 53B shows the extraction efficiency of an aluminum electrode versus the thickness of the ETL layer. A second trace 54B shows the extraction efficiency of a silver electrode versus the thickness of the ETL layer. A peak shift 55B is defined by the change in thickness between a first peak extraction efficiency 56B associated with the first trace 53B and a second peak extraction efficiency 57B associated with the second trace 54B. The peak shift is due to the different material for the reflector causing a different phase shift on reflection of light incident on the corresponding electrode.

Figure 6:
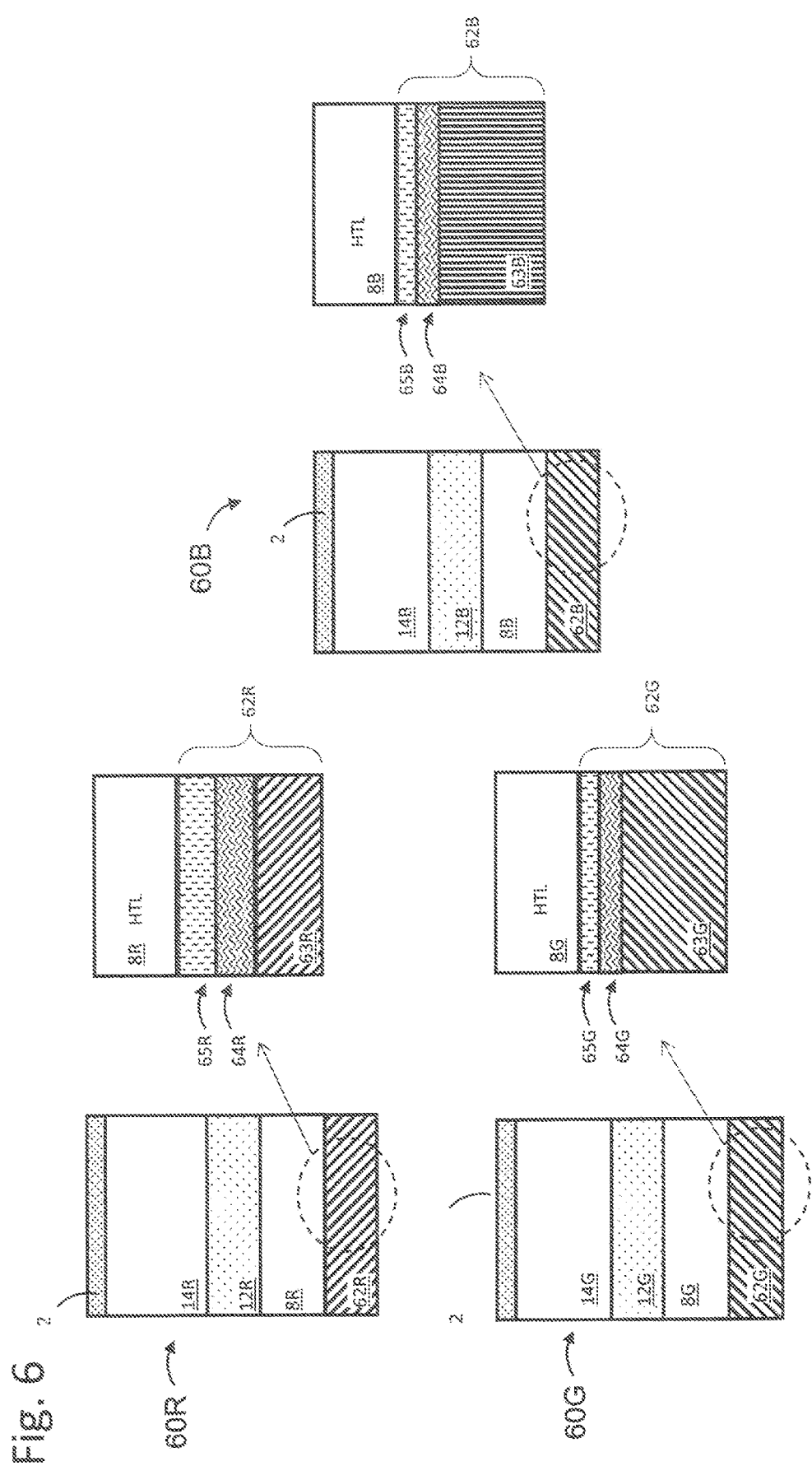
FIG. 6 is a drawing depicting three multilayer reflective electrodes in accordance with embodiments of the present invention.

FIG. 6 is a drawing depicting three multilayer reflective electrodes in accordance with embodiments of the present application. As to each sub-pixel, an overall structural view is shown, along with a close-up view of the bottom electrode layer as indicated by the oval indicators in the figure. FIG. 6 includes a top-emitting red sub-pixel 60R with a red multilayer bottom electrode 62R, a top-emitting green sub-pixel 60G with a green multilayer bottom electrode 62G, and a top-emitting blue sub-pixel with a blue multilayer bottom electrode 62B. The sub-pixels in FIG. 6 have certain layers that are comparable as in the conventional configurations of FIGS. 1 and 2 and the embodiment of FIG. 3, and thus like layers are identified with like reference numerals.

The bottom electrode 62 may be a metal reflector comprising a composite structure including multiple metal and non-metal layers that are different for each sub-pixel. The composite structure provides more control on the actual phase shift than relying on single metal sub-pixel combinations. The red multilayer bottom electrode 62R may include a base layer 63R, a first top layer 64R and a second top layer 65R. The red multilayer bottom electrode 62R may be configured to introduce an effective phase shift on reflection corresponding to a wavelength associated with red light. The green multilayer bottom electrode 62G may include a base layer 63G, a first top layer 64G and a second top layer 65G. The green multilayer bottom electrode 62G may be configured to introduce an effective phase shift on reflection corresponding to a wavelength associated with green light. The blue multilayer bottom electrode 62B may include a base layer 63B, a first top layer 64B and a second top layer 65B. The blue multilayer bottom electrode 62B may be configured to introduce an effective phase shift on reflection corresponding to a wavelength associated with blue light.

The multiple top layers, for example the first top layer 64 and the second top layer 65, may impact the electron/hole transport into the adjacent transport layers such as HTL 8. This transport is governed by a metal work function and it is desirable that a particular work function is used for optimum charge carrier transport. To improve the electron/hole transport into the adjacent transport layers, a very thin single additional layer of a metal can be used between the bottom electrode and the HTL 8. Suitable materials for use as the multiple layers include any of the materials listed as suitable for the single layer reflector, with the layer materials being selected for optimized phase shift associated with each color sub-pixel.

Figure 7:
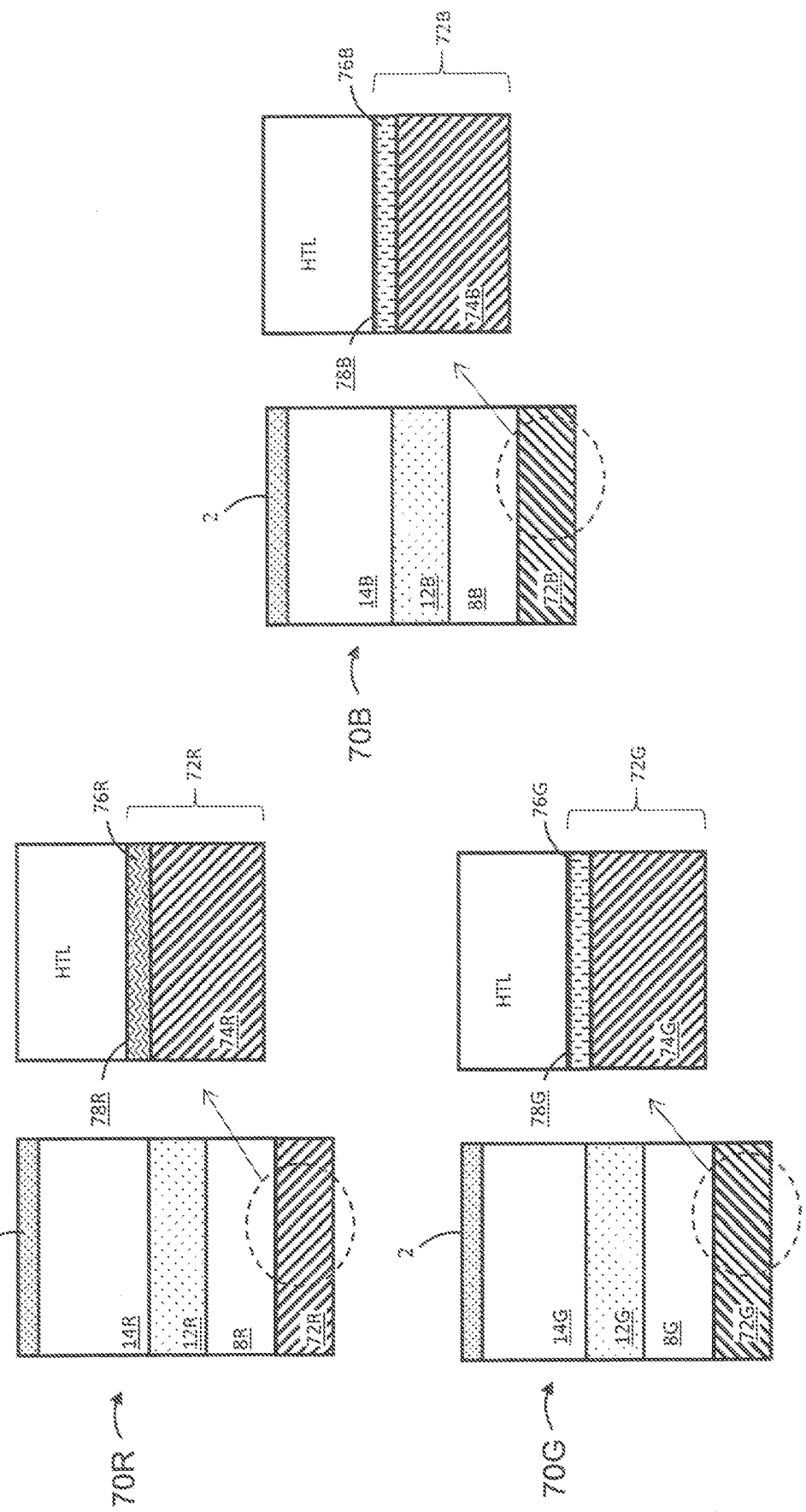
FIG. 7 is a drawing depicting three thin-layer reflective electrodes in accordance with embodiments of the present invention.

FIG. 7 is a drawing depicting three thin-layer reflective electrodes in accordance with embodiments of the present application. As to each sub-pixel, an overall structural view is shown, along with a close-up view of the bottom electrode layer as indicated by the oval indicators in the figure. FIG. 7 includes a top-emitting red sub-pixel 70R with a red thin-layer bottom electrode 72R, a top-emitting green sub-pixel 70G with a green thin-layer bottom electrode 72G, and a top-emitting blue sub-pixel 70B with a blue thin-layer bottom electrode 72B. The sub-pixels in FIG. 7 have certain layers that are comparable as in the conventional configurations of FIGS. 1 and 2 and the embodiment of FIG. 3, and thus like layers are identified with like reference numerals. An additional layer 76 of a metal deposited on a base electrode layer 74 facilitates transport of charge carriers across the metal boundary 78 so the effective work function is that of the base metal. The top-emitting red sub-pixel 70R includes a first thin layer 76R, the top-emitting green sub-pixel 70G includes a second thin layer 76G, and the top-emitting blue sub-pixel 70B includes a third thin layer 76B. The additional layer 76 introduces an additional optical phase shift that is controllable by the selection of material and the thickness of the layer.

Suitable materials for use as a thin layer include any of the materials listed as suitable for the single layer or multiple reflector with silver and/or aluminum as the preferred materials. Gold and/or copper may be used in alternative embodiments. Gold and/or copper introduce additional color effects on light emitted from the corresponding pixel. A gold thin layer may be used to form a thin layer in a red sub-pixel or a green sub-pixel. Copper may be used to form a thin layer in a red sub-pixel. Titanium and chromium may be particularly suitable due to their good wettability facilitating the deposition of very thin layers. The thickness of these thin layers may be from 0.5 nm to 12 nm.

Referring more specifically to the multilayer reflective electrode configurations of FIGS. 6 and 7, the following provides a basis for optimizing the additional emitting side thin layers to have thicknesses less than or equal to about 12 nm. As referenced above, in the three-layer embodiment of FIG. 6, each of the reflective electrodes 62R, 62G, and 62B has a base layer 63R, 63G, and 63B. In addition, each of the set of combined emitting side thin layers 64R/65R, 64G/65G, and 64B/65B for each of the R, G, and B pixel structures has a combined thickness of less than or equal to 12 nm (more particularly from 0.5 nm to 12 nm). In the two-layer embodiment of FIG. 7, each of the reflective electrodes 72R, 72G, and 72B has a base layer 74R, 74G, and 74B. In addition, each of the emitting side thin layers 76R, 76G, and 76B for each of the R, G, and B pixel structures has a thickness of less than or equal to 12 nm (again more particularly from 0.5 nm to 12 nm). Each of the base layers for each of the R, G, and B pixel structures, base layers 63R/G/B in FIG. 6 and base layers 72R/G/B in FIG. 7, as is conventional, has a thickness of about 80-100 nm, and thus generally a combined thickness of the one or more emitting side layers is less than a thickness of the corresponding base layers.

In addition, a real component of the refractive index of the multiple layers increases layer by layer in the direction toward the emitting side or top electrode 2. In other words, in the three-layer configuration of FIG. 6, for each of R, G, and B pixel structures, the real component of refractive index (RRI) is highest for second emitting side layers 65R/G/B, intermediate for first emitting side layers 64R/G/B, and lowest for base layers 63R/G/B, i.e., RRI layer 63<RRI layer 64<RRI layer 65 in each R, G, and B pixel structure. In the two-layer configuration of FIG. 7, for each of R, G, and B pixel structures, the real component of refractive index (RRI) is higher for emitting side layers 76R/G/B than for base layers 74R/G/B, i.e., RRI layer 74<RRI layer 76 in each R, G, and B pixel structure.

Again, the combined additional first and second emitting side layers 64 and 65 in each pixel structure in FIG. 6, and each of the additional emitting side layers 76 in each pixel structure of FIG. 7, have a thickness of 0.5 nm to 12 nm. This optimal range of thickness is related to the evanescent field created by the incident light. As is known in the art, the electric field of a one-dimensional light ray propagates in a dielectric of reflective index n with the wave equation:

$$\exp(i\omega t - inkx) \tag{1}$$

where x is the position, t is time, $\omega$ is the angular frequency, and $k=2\pi/\lambda$ is the wavenumber, $\lambda$ being the wavelength of the wave. $\omega\lambda/2\pi$=the speed of the wave in the dielectric=c/n, and c is the speed of light in a vacuum.

Propagation of light in a metal is very different, though the same equation generally applies. In this case the metal refractive index is complex, $n=n_R-i\kappa$, where $n_R$ is the real component and $\kappa$ is known as the extinction coefficient. The wave equation for propagation becomes now:

$$\exp(i\omega t - in_R kx)\exp(-\kappa kx) \tag{2}$$

For most metals, $\kappa \gg n_R$, which means that the propagation in x is an exponentially reducing function, over a 1/e mean distance of $1/k\kappa = \lambda/2\pi\kappa$. The exponentially dying light is called an evanescent wave.

When light in a dielectric with real refractive index n is incident on a metal of reflective index $n_M=n_R-i\kappa$, the reflectivity can be calculated using Fresnel reflection theory (the * refers to the complex conjugate):

$$R=((n-n_M)/(n+n_M))((n-n_M)/(n+n_M))^* \tag{3}$$

Because the index $n_M$ is largely imaginary, a majority of the light is reflected. However, because the metal has a small real component to the refractive index, R<1, some energy is propagated into the metal as an evanescent wave that exponentially dies according to equation (2) above. Usually this light is simply absorbed.

The phase shift $\phi$ of this reflected light is readily calculated from Fresnel theory and can be stated as:

$$\tan \phi = 2\kappa n/(n^2 - n_R^2 - \kappa^2) \tag{4}$$

When an emitting side metal layer is sufficiently thin and there is another metal base layer underneath it relative to the emitting side, the evanescent wave is not fully absorbed and there will be a reflection of the evanescent wave such that the evanescent wave will propagate back through the metal emitting side layer to the dielectric. When the evanescent wave reaches the dielectric, the evanescent wave can propagate as a non-evanescent wave according to equation (1), and thus the evanescent wave will interfere with the main reflected wave due to the propagated phase shift. This will alter the phase of the resulting reflection.

Accordingly, when the additional emitting side layer (or layers) does not exist, the phase shift will be determined solely by the base metal layer. When the additional emitting side layer (or layers) is added and is sufficiently thin, i.e. half the 1/e mean propagation distance of the evanescent wave in the emitting side layer=$\lambda/4\pi\kappa$, then the phase shift will be determined by the additional emitting side metal layer interfering with its own evanescent wave reflected by the base metal layer, which is dependent on the base metal refractive index. Thus, an intermediate state between the two metal phase shifts can be obtained, and the parameters can be set to provide constructive interference as described above.

Looking to specific material examples, for aluminium $\kappa \approx 7$, giving an emitting side layer thickness at 620 nm wavelength of <7 nm. For silver, so this emitting side layer thickness is about 12 nm. These thickness values are dependent on the wavelength to be emitted by a given pixel, so will vary with red versus green versus blue emissive layers. Thus, the emitting side metal layer thickness, which is the thickness of combined layers 64 and 65 in FIG. 6 and the thickness of layers 76 in FIG. 7, should be less than these values to have a substantial effect on the phase shift to provide constructive interference. More generally, therefore, as referenced above thicknesses 0.5 nm to 12 nm are suitable depending on the wavelength of light (R, G, or B) to be emitted by a given pixel or light-emitting structure.

In addition, as referenced above it is desirable that the layer closest to the top electrode, i.e., the emitting side layer, should be the metal layer with the highest real component of the refractive index. This means more energy can be transmitted to the evanescent field in the metal to implement the phase shift. Thus, for a silver/aluminium combination, silver has an $n_R \approx 0.1$ and aluminium $n_R \approx 1$. Accordingly, the silver material should form the base layer and the aluminium layer should form the one or more emitting side thin layers. Accordingly, in a two-layer configuration such as depicted in FIG. 7, the emitting side layer has a real component of refractive index that is higher than a real component of refractive index of the base layer. In a three-layer configuration such as depicted in FIG. 6, the second (uppermost or closest to electrode 2) emitting side layer has a real component of refractive index that is higher than a real component of refractive index of the first (lower or farther from electrode 2) emitting side layer, and the first emitting side layer has a real component of refractive index that is higher than a real component of refractive index of the base layer.

FIG. 8 is a drawing depicting two patterned reflective electrodes in accordance with embodiments of the present application. As to each sub-pixel, an overall structural view is shown, along with a close-up view of the bottom electrode layer as indicated by the oval indicators in the figure. FIG. 8 includes a top-emitting red sub-pixel 80R with a red patterned bottom electrode 82R, a top-emitting green sub-pixel 80G with a green patterned bottom electrode 82G, and a top-emitting blue sub-pixel 80B with a blue patterned bottom electrode 82B. The sub-pixels in FIG. 8 have certain layers that are comparable as in the conventional configurations of FIGS. 1 and 2 and the embodiment of FIG. 3, and thus like layers are identified with like reference numerals. The patterned electrodes described in FIG. 8 may be used in combination with any of the embodiments described herein.

The patterned bottom electrode 82 may include an additional metal layer 84 that can be patterned in two dimensions, either with apertures 86 or with other types of three dimensional structures formed on the metal layer 84. The structure may be different for each sub-pixel to introduce different, controllable phase shifts to the reflected light. An aperture array may be configured with apertures of radial or length dimension 87 and separation distance 88 that are significantly smaller than the wavelength of light associated with the corresponding sub-pixel so that the apertures provide a reduced mean refractive index between the reflector and the transport layer and thus provide a different phase shift on reflection. The length dimension 87 of the apertures 86 is significantly smaller than the cavity size and larger than the thickness of the layer. The separation distance 88 between apertures may vary between apertures 86 to form a random array.

In an exemplary embodiment, the apertures 86 may be approximately circular. The apertures 86 in the structure can be formed by electron beam etching or by an evaporative mask process. The density of the apertures 86 may vary between the different sub-pixels to afford a different phase shift. For example, the red patterned bottom electrode 82R includes a first number of apertures per unit area at a first size and a first separation, the green patterned bottom electrode 82G includes a second number of apertures per unit area at a second size and a second separation, and the blue patterned bottom electrode 82B includes a third number of apertures per unit area at a third size and a third separation, which may be different for sub-pixels of different colors. The number of apertures per unit area, the size, and the separation may be equal between two or more sub-pixels. Apertures 86 may be added to a single metal base reflector layer by using this process. In this case it is also possible to vary the depth in addition to, or instead of, the aperture density.

While embodiments described herein largely have been described using a top emitting "normal structure", one of ordinary skill in the art would recognize many variations, modifications, and alternatives in which embodiments of the present application may be used, including application of comparable principles to inverted and/or bottom emitting structures.

Figure 9B:
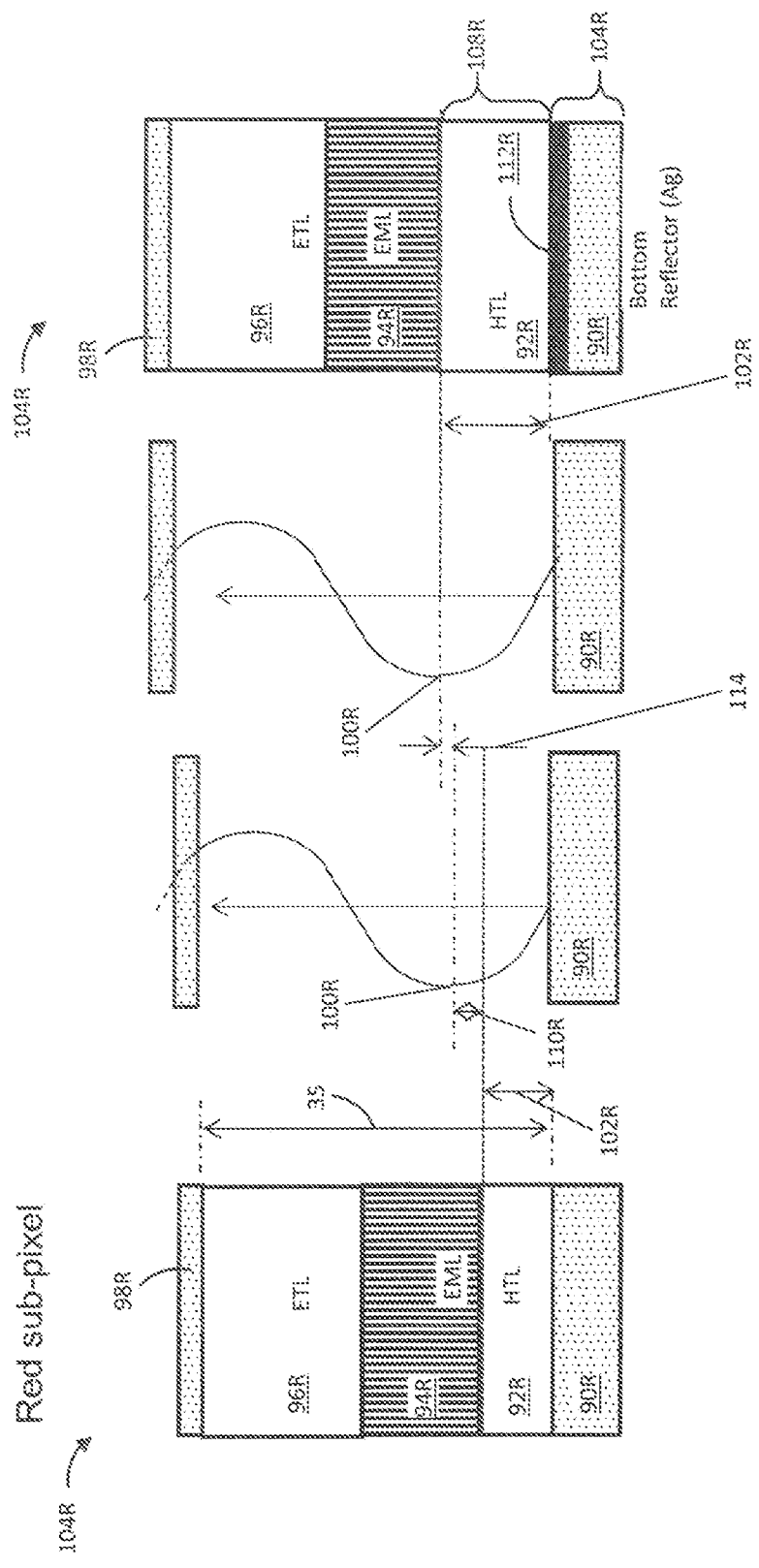

In an exemplary embodiment, the present invention may be combined with an EML of varying thickness as shown in FIGS. 9A, 9B, and 9C. Additional description related to EMLs of varying thickness is provided in U.S. patent application Ser. No. 16/446,677, filed on Jun. 20, 2019, the disclosure of which is hereby incorporated by reference in its entirety for all purposes.

FIGS. 9A, 9B, and 9C are drawings depicting constructive interference in sub-pixels in accordance with embodiments of the present invention. The three sub-pixels in FIGS. 9A, 9B, and 9C use a bottom reflector 90, an HTL 92, an EML 94, an ETL 96, and a top electrode 98. The bottom reflector 90 may be silver. The HTL 92 may be a PEDOT:PSS and TFB charge transport layer. The ETL 96 may be a ZnO nanoparticle charge transport layer. The top electrode 98 may be formed with a silver/magnesium material. The layer thickness and emission locations are chosen so that the best optical mode is excited by aligning a maximum 100 of the mode with an emission height 102. Generally, the layer thicknesses and emission location are chosen primarily to align the blue sub-pixel 104B with one of its maxima, as the blue sub-pixel has the lowest overall efficiency compared to the red sub-pixel 104R and the green sub-pixel 104G.

FIG. 9A shows the alignment of the maximum 100B of the blue sub-pixel 104B. A thickness of the EML 106B and a thickness of the HTL 108B may be chosen to shift the emission height 102B in the cavity 35 of the blue sub-pixel 104B. The adjusted thicknesses move align the maximum 100B to eliminate the mode maximum misalignment 110B. The thickness of the HTL 108B will remain the same in both the red sub-pixel 104R and the green sub-pixel 104G.

Accordingly, the sub-pixels are not aligned with their respective maxima and one or more embodiments described herein may be incorporated to introduce a phase shift.

FIG. 9B shows the alignment of the maximum 100R of the red sub-pixel 104R using a second reflector 112R. A first red sub-pixel 104R is shown without the second reflector 112R and a second red sub-pixel 104R with the second reflector 112R to introduce a phase shift to introduce a phase shift 114 to eliminate the mode maximum misalignment 110R. The second reflector 92R may be a thin (3–5 nm) aluminum layer. The aluminum layer is configured to retard the phase on reflection relative to silver and a thicker cavity 35 to accommodate the phase change is provided by varying the thickness 108R of the HTL 92R.

FIG. 9C shows the alignment of the maximum 100G of the green sub-pixel 104G using a thickness of the EML 106G and a thickness of the HTL 108G to shift the emission height 102G in the cavity 35. Adjusting the thicknesses moves the emission height 102G and reduces the mode maximum misalignment 110G. The arrangement of the blue sub-pixel 104B, the red sub-pixel 104R, and the green sub-pixel 104G better aligns the maxima of the mode with the emission heights in order to give a higher extraction efficiency for all three sub pixels.

While embodiments described herein largely have been described using a top emitting "normal structure", one of ordinary skill in the art would recognize many variations, modifications, and alternatives in which the present invention may be used, including application of comparable principles to inverted and/or bottom emitting structures.

An aspect of the invention therefore is a light-emitting layer structure that maximizes constructive interference for light emission by varying a phase shift introduced by reflective electrodes. In exemplary embodiments, the light emitting layer structure includes a first optical cavity including a first reflective electrode; a first partially transparent electrode; and a first emissive layer (EML) disposed between the first reflective electrode and the partially transparent electrode, wherein the first EML is configured to emit light having a first wavelength; wherein the first reflective electrode is configured to introduce a first phase shift, depending on the first wavelength, on reflection of light emitted by the first EML; and a second optical cavity including a second reflective electrode; a second partially transparent electrode; and a second EML disposed between the second reflective electrode and the second partially transparent electrode, wherein the second EML is configured to emit light having a second wavelength; wherein the second reflective electrode is configured to introduce a second phase shift, depending on the second wavelength, on reflection of light emitted by the second EML, and the first phase shift is different from the second phase shift. Each of the first reflecting electrode and the second reflecting electrode comprises a base layer and at least one emitting side layer located on an emitting side of the base layer, wherein the at least one emitting side layer has a thickness less than a thickness of the base layer. The light-emitting layer structure may include one or more of the following features, either individually or in combination.

In an exemplary embodiment of the light emitting layer structure, the at least one emitting side layer has a thickness from 0.5 nm to 12 nm.

In an exemplary embodiment of the light emitting layer structure, the at least one emitting side layer has a real component of refractive index that is higher than a real component of refractive index of the base layer.

In an exemplary embodiment of the light emitting layer structure, the at least one emitting side layer includes aluminum and the base layer includes silver.

In an exemplary embodiment of the light emitting layer structure, the at least one emitting side layer comprises a first emitting side layer and a second emitting side layer located on an emitting side of the first emitting side layer, wherein a combined thickness of the first emitting side layer and the second emitting side layer is less than the thickness of the base layer.

In an exemplary embodiment of the light emitting layer structure, the combined thickness of the first emitting side layer and the second emitting side layer is from 0.5 nm to 12 nm.

In an exemplary embodiment of the light emitting layer structure, the second emitting side layer has a real component of refractive index that is higher than a real component of refractive index of the first emitting side layer, and the first emitting side layer has a real component of refractive index that is higher than a real component of refractive index of the base layer.

In an exemplary embodiment of the light emitting layer structure, the base layer has a thickness of 80-100 nm.

In an exemplary embodiment of the light emitting layer structure, the first phase shift is configured to cause light having the first wavelength to propagate in the first optical cavity at a first mode and the second phase shift is configured to cause light having the second wavelength to propagate in the second optical cavity at a second mode.

In an exemplary embodiment of the light emitting layer structure, the first reflective electrode comprises a first material for introducing the first phase shift and the second reflective electrode comprises a second material for introducing the second phase shift.

In an exemplary embodiment of the light emitting layer structure, the first material includes at least one of silver, aluminum, chromium, tin, titanium, palladium, gallium, platinum, tungsten, tantalum, zirconium, a conductive non-metallic material, and an interference film layer.

In an exemplary embodiment of the light emitting layer structure, the first reflective electrode includes a first plurality of layers and the second reflective electrode comprises a second plurality of layers.

In an exemplary embodiment of the light emitting layer structure, the first plurality of layers and the second plurality of layers have a respective first top layer and second top layer with a thickness between 0.5 nm and 30 nm.

In an exemplary embodiment of the light emitting layer structure, each layer of the first plurality of layers and each layer of the second plurality of layers comprises at least one of silver, aluminum, chromium, tin, titanium, palladium, gallium, platinum, tungsten, tantalum, zirconium, a conductive non-metallic material, and an interference film layer.

In an exemplary embodiment of the light emitting layer structure, a first surface of the first reflective electrode has a first pattern to introduce the first phase shift corresponding to the first wavelength and a second surface of the second reflective electrode has a second pattern to introduce the second phase shift corresponding to the second wavelength. The first pattern and the second pattern may be configured as a plurality of apertures. In an exemplary embodiment of the light emitting layer structure, the first pattern has a first size, a first separation, and a first depth corresponding to the first phase shift. In an exemplary embodiment of the light emitting layer structure, the second pattern has a second size, a second separation, and a second depth corresponding to the second phase shift.

In an exemplary embodiment of the light-emitting layer structure, the light-emitting layer structure includes a substrate; a first sub-pixel including a first sub-pixel electrode layer deposited on the substrate; a first charge transport layer deposited on the first electrode layer; a first emissive layer (EML) deposited on the first charge transport layer configured to emit light having a first wavelength; a second charge transport layer deposited on the first EML; and a second electrode layer deposited on the second charge transport layer; wherein at least one of the first sub-pixel electrode layer is configured to introduce a phase shift, depending on the first wavelength, on reflection of light emitted by the first EML; and a second sub-pixel including a second sub-pixel electrode layer deposited on the substrate; a third charge transport layer deposited on the second sub-pixel electrode layer; a second EML deposited on the first charge transport layer configured to emit light having a second wavelength; a fourth charge transport layer deposited on the second EML; and a second electrode layer deposited on the fourth charge transport layer; wherein the second sub-pixel electrode layer is configured to introduce a second phase shift, depending on the second wavelength, on reflection of light emitted by the second EML, and the first phase shift is different from the second phase shift.

In an exemplary embodiment of the light-emitting layer structure, the first phase shift is configured to cause light having the first wavelength to propagate in the first sub-pixel at a first mode and the second phase shift is configured to cause light having the second wavelength to propagate in the second sub-pixel at a second mode.

In an exemplary embodiment of the light-emitting layer structure, the first sub-pixel electrode layer includes a first material for introducing the first phase shift and the second sub-pixel layer comprises a second material for introducing the second phase shift.

In an exemplary embodiment of the light-emitting layer structure, the first sub-pixel electrode layer comprises a first plurality of layers and the second sub-pixel layer comprises a second plurality of layers.

In an exemplary embodiment the light-emitting layer structure includes a first surface having a first pattern is disposed between the first sub-pixel electrode layer and the first charge transport layer to introduce the first phase shift corresponding to the first wavelength. In an exemplary embodiment of the light-emitting layer structure, a second surface having a second pattern is disposed between the second sub-pixel electrode layer and the third charge transport layer to introduce the second phase shift corresponding to the second wavelength.

In an exemplary embodiment the light-emitting layer structure includes a third sub-pixel including a third sub-pixel electrode layer deposited on the substrate; the first charge transport layer deposited on the third sub-pixel electrode layer; a third EML deposited on the first charge transport layer configured to emit light associated with a third wavelength; the second charge transport layer deposited on the third EML; and the second electrode layer deposited on the second charge transport layer; wherein the third sub-pixel electrode layer is configured to introduce a third phase shift, depending on the third wavelength, on reflection of light emitted by the third EML; wherein the first, second, and third sub-pixels correspond to red, green, and blue sub-pixels.

In an exemplary embodiment of the light-emitting layer structure, the third phase shift is configured to cause light having the third wavelength to propagate at a first mode.

In an exemplary embodiment of the light-emitting layer structure, the third sub-pixel electrode layer comprises a third material for introducing the third phase shift.

In an exemplary embodiment of the light-emitting layer structure, at least one of the emissive layers includes quantum dots for light emission.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

INDUSTRIAL APPLICABILITY

The present invention relates to a layer structure used for light emitting devices, in particular, for QLED displays. Hardware manufactured using this disclosure may be useful in a variety of fields that use QLED displays including gaming, entertainment, task support, medical, industrial design, navigation, transport, translation, education, and training.

REFERENCE SIGNS LIST

1—light
2—top electrode
3—xyz-coordinate system
4—substrate
6—bottom electrode
8—hole transport layer (HTL)
8a—first HTL sub-layer
8b—second HTL sub-layer
10—top emitting (TE) light-emitting device structure
12—emissive layer (EML)
12R—red sub-pixel EML
12G—green sub-pixel EML
12B—blue sub-pixel EML
14—electron transport layer (ETL)
16—layer thickness
20—bottom emitting (BE) light-emitting device structure
22—bottom electrode
24—transparent substrate
26—HTL
28—emissive layer (EML)
30—ETL
32—top electrode
33—top-emission display pixel
34R—red sub-pixel
34G—green sub-pixel
34B—blue sub-pixel
35—optical cavity
40R—red electrical field distribution
40G—green electrical field distribution
40B—blue electrical field distribution
41G—green reflection
41R—red reflection
41B—blue reflection
53B—blue first trace
53R—red first trace
53G—green first trace
54B—blue second trace
54R—red second trace
54G—green second trace
55B—blue peak shift
55G—green peak shift
55R—red peak shift
56B—blue first peak extraction efficiency
56G—green first peak extraction efficiency
56R—red first peak extraction efficiency
57B—blue second peak extraction efficiency
57G—green second peak extraction efficiency
57R—red second peak extraction efficiency
60R—top-emitting red sub-pixel
61—bottom electrode
61R—red sub-pixel
61G—green sub-pixel
61B—blue sub-pixel
62—bottom electrode
62B—blue multilayer bottom electrode
62G—green multilayer bottom electrode
62R—red multilayer bottom electrode
63B—base layer
63G—base layer
63R—base layer
64—first top layer
64B—first top layer
64G—first top layer
64R—first top layer
65—second top layer
65B—second top layer
65G—second top layer
65R—second top layer
70B—top-emitting blue sub-pixel
70G—top-emitting green sub-pixel
70R—top-emitting red sub-pixel
72B—blue thin-layer bottom electrode
72G—green thin-layer bottom electrode
72R—red thin-layer bottom electrode
74—base electrode layer
76—layer
76R—first thin layer
76G—second thin layer
76B—third thin layer
78—metal boundary
80R—top-emitting red sub-pixel
80G—top-emitting green sub-pixel
80B—top-emitting blue sub-pixel
82—patterned bottom electrode
82R—red patterned bottom electrode
82G—green patterned bottom electrode
82B—blue patterned bottom electrode
84—additional metal layer
86—apertures
87—length dimension
88—separation distance
90—bottom reflector
92—HTL
94—EML,
96—ETL
98—top electrode
100—mode maximum
102—emission height
104B—blue sub-pixel
104G—green sub-pixel
104R—red sub-pixel
106R—red EML
106G—green EML
106B—blue EML
108R—red HTL 108G—green HTL
108B—blue HTL
110R—red maximum misalignment
110G—green maximum misalignment
110B—blue maximum misalignment
112R—second reflector
114—phase shift

What is claimed is:

1. A light-emitting layer structure comprising:
a first optical cavity comprising:
 a first reflective electrode;
 a first partially transparent electrode; and
 a first emissive layer (EML) disposed between the first reflective electrode and the first partially transparent electrode, wherein the first EML is configured to emit light having a first wavelength;
 wherein the first reflective electrode is configured to introduce a first phase shift, depending on the first wavelength, on reflection of light emitted by the first EML; and
a second optical cavity comprising:
 a second reflective electrode;
 a second partially transparent electrode; and
 a second EML disposed between the second reflective electrode and the second partially transparent electrode, wherein the second EML is configured to emit light having a second wavelength;
 wherein the second reflective electrode is configured to introduce a second phase shift, depending on the second wavelength, on reflection of light emitted by the second EML, and the first phase shift is different from the second phase shift;
where each of the first reflecting electrode and the second reflecting electrode comprises a base layer and at least one emitting side layer located on an emitting side of the base layer, wherein the at least one emitting side layer has a thickness less than a thickness of the base layer;
wherein the at least one emitting side layer comprises a first emitting side layer and a second emitting side layer located on an emitting side of the first emitting side layer, wherein a combined thickness of the first emitting side layer and the second emitting side layer is less than the thickness of the base layer.

2. The light-emitting layer structure of claim 1, wherein the at least one emitting side layer has a thickness from 0.5 nm to 12 nm.

3. The light-emitting layer structure of claim 1, wherein the at least one emitting side layer has a real component of refractive index that is higher than a real component of refractive index of the base layer.

4. The light-emitting layer structure of claim 1, wherein the at least one emitting side layer includes aluminum and the base layer includes silver.

5. The light emitting-layer structure of claim 1, wherein the combined thickness of the first emitting side layer and the second emitting side layer is from 0.5 nm to 12 nm.

6. The light emitting-layer structure of claim 1, wherein the second emitting side layer has a real component of refractive index that is higher than a real component of refractive index of the first emitting side layer, and the first emitting side layer has a real component of refractive index that is higher than a real component of refractive index of the base layer.

7. The light-emitting layer structure of claim 1, wherein the base layer has a thickness of 80-100 nm.

8. The light-emitting layer structure of claim 1, wherein the first phase shift is configured to cause light having the first wavelength to propagate in the first optical cavity at a first mode and the second phase shift is configured to cause light having the second wavelength to propagate in the second optical cavity at a second mode.

9. The light-emitting layer structure of claim 1, wherein the first reflective electrode includes a first material for introducing the first phase shift and the second reflective electrode includes a second material for introducing the second phase shift.

10. The light-emitting layer structure of claim 1, wherein the first emissive layer and/or the second emissive layer includes quantum dots for light emission.

* * * * *